(12) United States Patent
Takahashi

(10) Patent No.: US 7,105,438 B2
(45) Date of Patent: Sep. 12, 2006

(54) MANUFACTURING METHOD OF A SEMICONDUCTOR DEVICE WITH A METAL GATE ELECTRODE AND A STRUCTURE THEREOF

(75) Inventor: Akira Takahashi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/055,770

(22) Filed: Feb. 11, 2005

(65) Prior Publication Data

US 2005/0186792 A1 Aug. 25, 2005

(30) Foreign Application Priority Data

Feb. 20, 2004 (JP) ............................. 2004-044790

(51) Int. Cl.
*H01L 21/4763* (2006.01)
(52) U.S. Cl. ................ 438/640; 438/672; 438/E21.135
(58) Field of Classification Search ................ 438/672, 438/685, 706, 723, 724, 640
See application file for complete search history.

(56) References Cited

U.S. PATENT DOCUMENTS

| 5,902,132 | A  |   | 5/1999  | Mitsuhashi |         |
|-----------|----|---|---------|------------|---------|
| 6,165,880 | A  | * | 12/2000 | Yaung et al. | 438/592 |
| 6,297,109 | B1 | * | 10/2001 | Chan et al. | 438/300 |
| 6,346,482 | B1 | * | 2/2002  | Matsumoto et al. | 438/706 |
| 6,518,636 | B1 |   | 2/2003  | Segawa et al. |     |
| 6,573,132 | B1 |   | 6/2003  | Uehara et al. |     |
| 6,576,152 | B1 |   | 6/2003  | Matsutani |        |

FOREIGN PATENT DOCUMENTS

| JP | 10-172962   | 6/1998  |
| JP | 2000-049340 | 2/2000  |
| JP | 2000-340792 | 12/2000 |
| JP | 2001-203349 | 7/2001  |

* cited by examiner

*Primary Examiner*—David Nelms
*Assistant Examiner*—Quoc Hoang
(74) *Attorney, Agent, or Firm*—VolentineFrancosWhitt,PLLC

(57) ABSTRACT

In a manufacturing method of a semiconductor device, a metallic gate electrode film, a protective film and an offset nitride film are formed on a semiconductor substrate to compose a stacked structure. An insulating film which covers the stacked structure is etched to expose the offset nitride film, and the exposed offset nitride film is etched to expose the protective film. The exposed protective film may be etched to expose the metallic gate electrode film under predetermined etching conditions. An etching rate of the protective film is greater than that of the metallic gate electrode film. The etching of the insulating film and the etching of the exposed offset nitride film may form a contact hole. A conductive plug is formed in the contact hole.

22 Claims, 9 Drawing Sheets

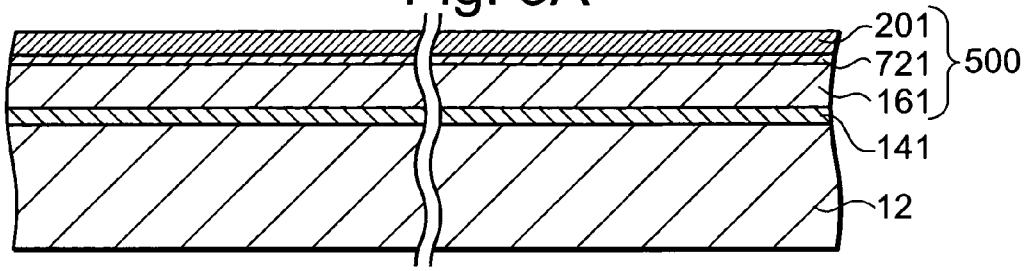
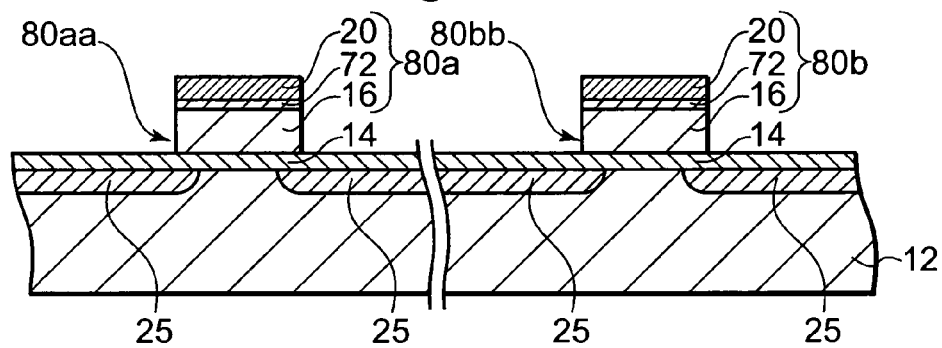
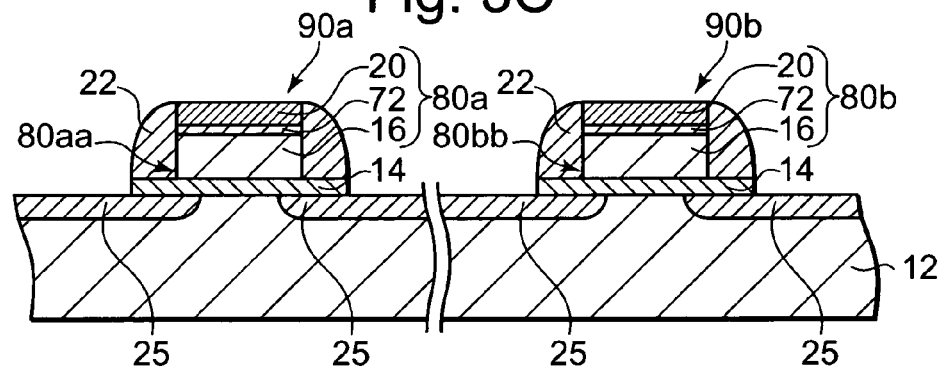
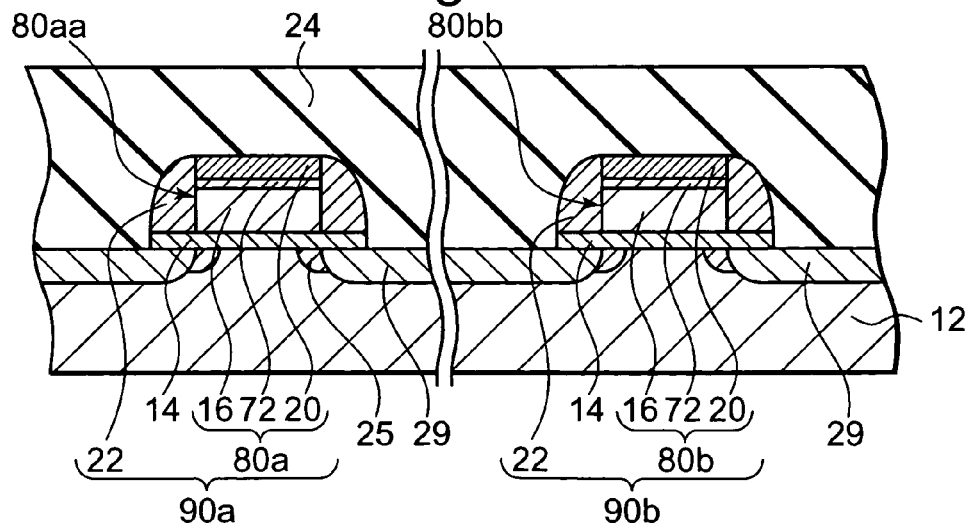

MANUFACTURING METHOD OF A SEMICONDUCTOR DEVICE WITH A METAL GATE ELECTRODE AND A STRUCTURE THEREOF

BACKGROUND OF THE INVENTION

1. Field of the Invention

The present invention relates to a manufacturing method and a structure of a semiconductor device, in particular, to a manufacturing method and a structure of a metallic gate electrode of a MOS transistor in the semiconductor device. This is a counterpart of and claims priority to Japanese Patent Application No. 2004-44790 filed on Feb. 20, 2004, which is herein incorporated by reference.

2. Description of the Related Art

In recent years, research and development of a more microscopic design rule have been promoted in the manufacturing method of the semiconductor device in order to meet demands of higher speed operation and lower power consumption in the semiconductor device. In particular, a dimensional precision is strenuously demanded in a process for forming a gate electrode of the MOS transistor. The performances of the semiconductor devices and equipments composed of the semiconductor devices greatly depend on the dimensional precision in the process. Also, research and development of new kinds of material for the gate electrode have been increasing. A metallic gate electrode made of a metallic material has gotten a lot of attention instead of a gate electrode composed of polycrystalline silicon, in order to reduce a resistance value of the gate electrode and to suppress a depletion portion in the gate electrode.

On the other hand, there has been proposed a self-aligned contact method (hereinafter referred to as "SAC method") as one of effective methods in order to miniaturize the size of the semiconductor device. When the semiconductor device is formed in the SAC method, an offset nitride layer (generally, a silicon nitride layer) is formed on the gate electrode and a sidewall nitride layer is formed on sidewalls of the gate electrode. Also, the gate electrode, the offset nitride layer and the sidewall nitride layer are covered with a inter-level oxide layer. In the SAC method, a contact hole is formed in the inter-level oxide layer with the contact hole self-aligned to the gate electrode by using a difference of etching rates between the inter-level oxide layer and the offset nitride layer or the sidewall nitride layer. That is, the contact hole can be formed while much more margin is ensured in stacking masks by the SAC method. Therefore, the semiconductor device which has a higher density can be realized. There have been proposed several manufacturing methods of the semiconductor device using the SAC method as described, for example, in a Document 1 (Japanese Patent Publication Laid-open No. H10-172962), a Document 2 (Japanese Patent Publication Laid-open No. 2000-49340), a Document 3 (Japanese Patent Publication Laid-open No. 2000-340792) and a Document 4 (Japanese Patent Publication Laid-open No. 2001-203349).

Recent attempts have been made to form a conductive contact plug on the metallic gate electrode by using the above-mentioned SAC method. However, when an etching rate of the offset nitride film is almost close to an etching rate of the metallic gate electrode film, the metallic gate electrode film may be overetched, when the offset nitride film is etched to expose an upper surface of the metallic gate electrode film. Then, a variation in an electrical characteristic such as the resistance value of the gate electrode may result. As a result, reliabilities of not only one of the semiconductor devices but also whole equipment composed of the semiconductor devices can be decreased. Therefore, it is desired that the overetching of the metallic gate electrode can be suppressed when the conductive contact plug is formed on the metallic gate electrode, so that electrical characteristics of the semiconductor device can be stabilized.

SUMMARY OF THE INVENTION

According to an aspect of the present invention, there is provided a manufacturing method of a semiconductor device which includes processes described below. A metallic gate electrode film, a protective film and an offset nitride film are sequentially formed on a semiconductor substrate to compose a stacked structure. The stacked structure and the semiconductor substrate are covered with an insulating film. The insulating film is etched to expose the offset nitride film, and the exposed offset nitride film is etched to expose the protective film. The exposed protective film is etched to expose the metallic gate electrode film under predetermined etching conditions. An etching rate of the protective film is greater than an etching rate of the metallic gate electrode film. The etching of the insulating film, the etching of the exposed offset nitride film and the etching of the exposed protective film form a contact hole. A conductive plug is formed in the contact hole.

According to another aspect of the present invention, there is provided a manufacturing method of a semiconductor device which includes processes described below. A metallic gate electrode film, a protective film and an offset nitride film are sequentially on a semiconductor substrate to compose a stacked structure. The stacked structure and the semiconductor substrate are covered with an insulating film. The insulating film is etched to expose the offset nitride film, and the exposed offset nitride film is etched to expose the protective film. The etching of the insulating film and the etching of the exposed offset nitride film form a contact hole. Then, a refractory metallic film is formed on the exposed protective film in the contact hole and is chemically reacted with the protective film to form a conductive film on the metallic gate electrode film. A conductive plug is formed in the contact hole. The conductive plug is electrically in contact with the metallic gate electrode film through the conductive film.

The above and further aspects and novel features of the invention will more fully appear from the following detailed description, appended claims and the accompanying drawings.

BRIEF DESCRIPTION OF THE DRAWINGS

FIGS. 3A–3K illustrate processes of manufacturing a semiconductor device according to a third preferred embodiment of the present invention.

DETAILED DESCRIPTION OF THE PREFERRED EMBODIMENTS

Embodiments of the present invention will be described hereinafter with references to the accompanying drawings.

The drawings used for this description illustrate major characteristic parts of embodiments in order that the present invention will be easily understood. However, the invention is not limited by these drawings.

FIGS. 1A–1J illustrate processes of manufacturing a semiconductor device according to a first preferred embodiment.

Figure 1A:
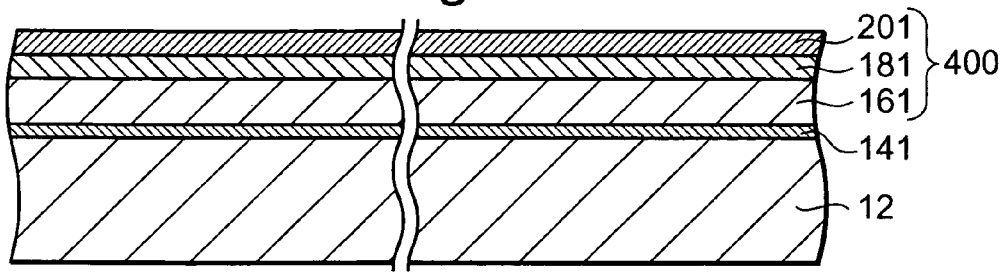
FIGS. 1A–1J illustrate processes of manufacturing a semiconductor device according to a first preferred embodiment of the present invention.

As shown in FIG. 1A, after a semiconductor substrate 12 which includes silicon is provided, a thin oxidized layer 141 is formed on the semiconductor substrate 12. In this example, the thin oxidized layer 141 includes aluminum oxide. Then, a stacked layer 400, which includes a metallic layer 161, a first covering layer 181 and a second covering layer 201, is formed on the thin oxidized layer 141 by chemical vapor deposition (hereinafter referred to as "CVD") techniques. In this example, a titanium nitride layer is formed on the thin oxidized layer 141 as the metallic layer 161, a silicon dioxide layer is formed on the metallic layer 161 as the first covering layer 181, and a silicon nitride layer is formed on the first covering layer 181 as the second covering layer 201. Also, the thin oxidized layer 141 has a thickness of 5 nm, the metallic layer 161 has a thickness of 100 nm, the first covering layer 181 has a thickness of 100 nm, and the second covering layer 201 has a thickness of 100 nm. In addition, a tungsten nitride layer or a tantalum nitride layer may be formed on the thin oxidized layer 141 as the metallic layer 161, instead of the titanium nitride layer.

Figure 1B:
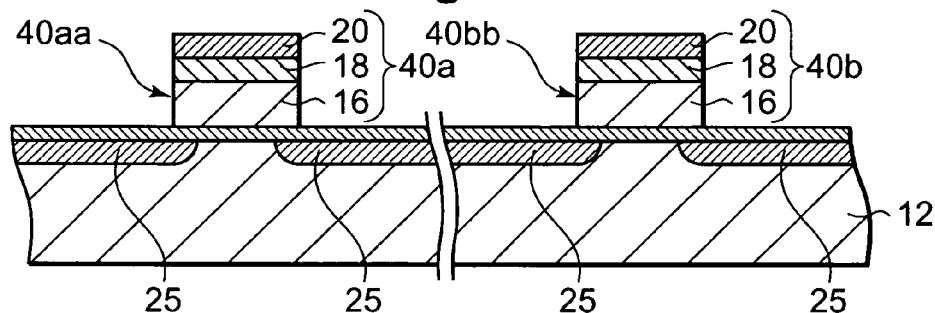

Next, a mask, which has a predetermined configuration of a gate electrode of a MOS transistor, is formed on the second covering layer 201, which is not shown in the figure. Then, the second covering layer 201, the first covering layer 181 and the metallic layer 161 of the stacked layer 400 are etched using the mask. That is, the second covering layer 201, the first covering layer 181 and the metallic layer 161 are etched so as to have the predetermined configuration of the gate electrode. As a result, as shown in FIG. 1B, metallic gate electrode films 16 being used as metal gate electrodes of the MOS transistors, protective films 18 (silicon dioxide films 18) and offset nitride films 20 (offset silicon nitride films 20) are formed on the thin oxidized film 141. Hereupon, the metallic gate electrode films 16, protective films 18 and offset nitride films 20 compose stacked structures 40a and 40b. Then, low concentration impurity regions 25, being used as source regions and drain regions of the MOS transistors, are formed in the semiconductor substrate 12 near the metallic gate electrode films 16 self-aligned to the stacked structures 40a and 40b.

Figure 1C:
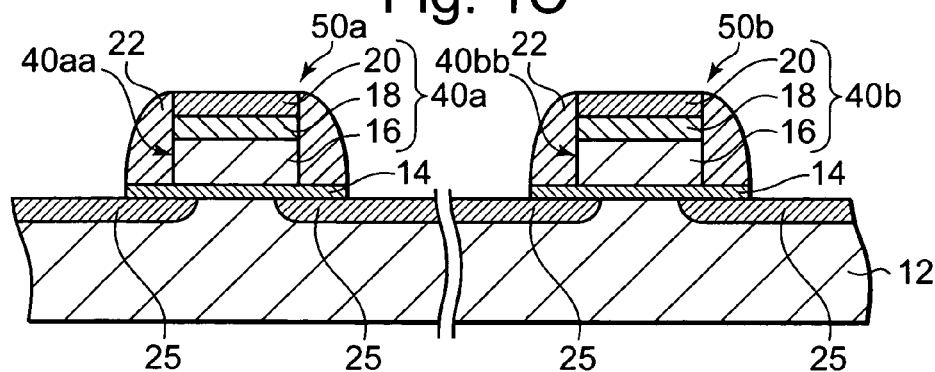

Subsequently, the oxidized layer 141 is etched so as to have a larger configuration than the predetermined configuration of the gate electrode. As a result, gate oxidized films 14 are formed on the semiconductor substrate 12 as shown in FIG. 1C, at areas where sidewall portions 22 are to be formed on the gate oxidized films 14. In more detail, a silicon nitride layer having a thickness of 100 nm is formed on the semiconductor substrate 12 and gate oxidized films 14, for example, by the CVD techniques, so that the stacked structures 40a and 40b and gate oxidized films 14 can be covered with the silicon nitride layer. Then, the silicon nitride layer is etched by anisotropic etching process. As a result, as shown in FIG. 1C, insulating sidewall portions 22 are formed on the gate oxidized films 14 and sidewalls 40aa and 40bb of the stacked structures 40a and 40b. The insulating sidewall portions 22 and the stacked structures 40a and 40b compose convex compound structures 50a and 50b spaced away from each other at a predetermined interval. Also, when the oxidized layer 141 including the aluminum oxide, hafnium aluminate or hafnium oxide which has a high dielectric constant is formed on the semiconductor substrate 12, the oxidized layer 141 may be etched using the stacked structures 40a and 40b as a mask by a wet chemical etching process after the stacked structures 40a and 40b are formed and before the sidewall portions 22 are formed.

Figure 1D:
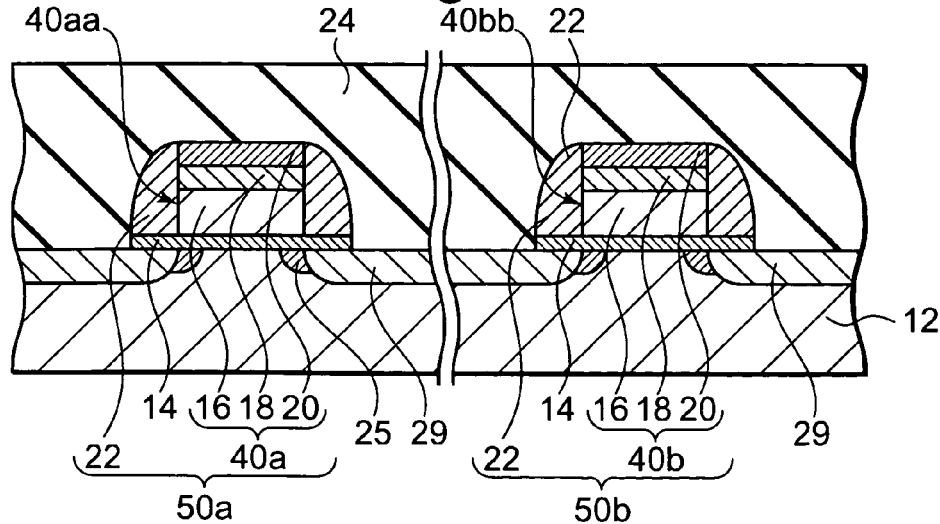

As shown in FIG. 1D, high concentration impurity regions 29, being also used as the source regions and drain regions of the MOS transistors, are formed in the semiconductor substrate near the metallic gate electrode films 16 self-aligned to the convex compound structures 50a and 50b. The low concentration impurity region 25 and the high concentration impurity region 29 compose a Light Doped Drain (LDD) structure. Then, an interlayer insulating film 24 is formed on the semiconductor substrate 12 for example, by the CVD techniques, so that the convex compound structures 50a and 50b can be covered with the interlayer insulating film 24. An upper surface of the interlayer insulating film 24 is made even by Chemical Mechanical Polishing (hereinafter referred to as "CMP") techniques. As a result, in this example, the interlayer insulating film 24 has a thickness of 500 nm.

Figure 1E:
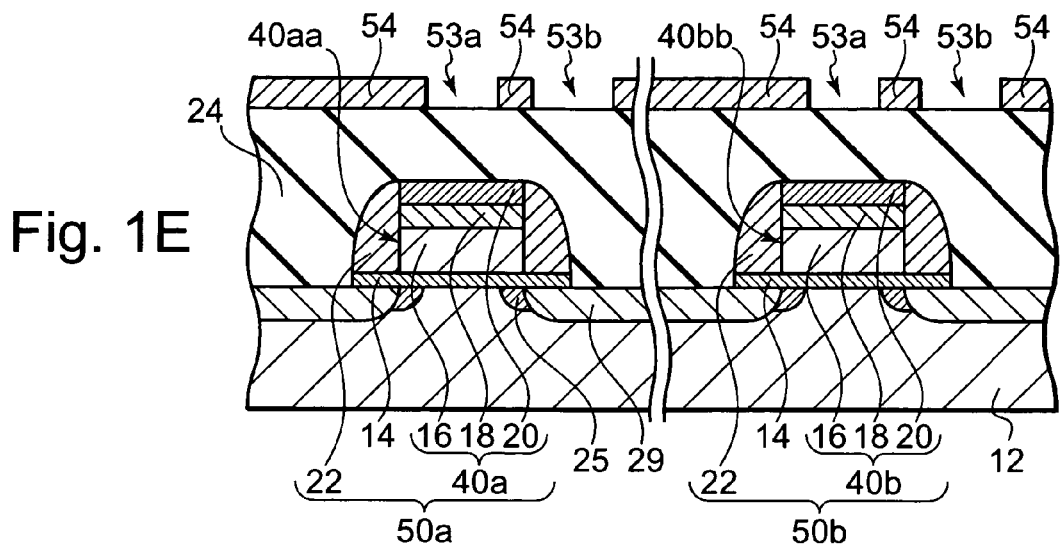
Figure 1F:
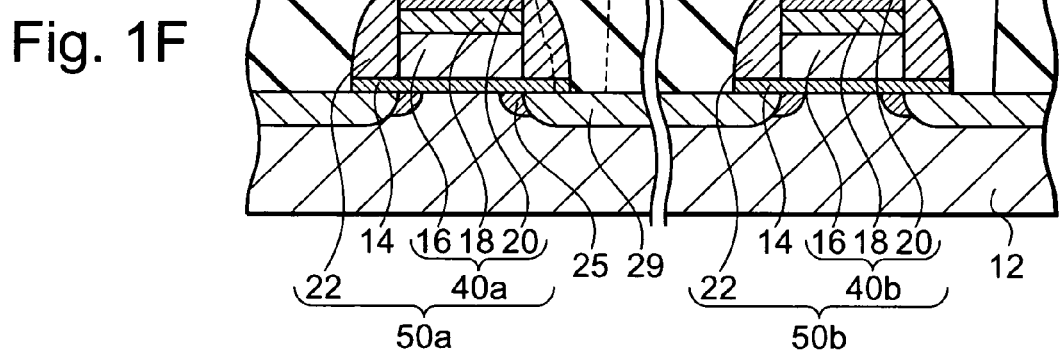

As shown in FIG. 1E, after forming a resist layer on the interlayer insulating film 24, a patterned resist mask 54 is formed by exposure and development processes. The patterned resist mask 54 has openings 53a and 53b to expose the interlayer insulating film 24 on the convex compound structures 50a and 50b and the high concentration impurity regions 29. Then, the interlayer insulating film 24 exposed by the openings 53a and 53b of the patterned resist mask 54 is etched by a first etching process as shown in FIG. 1F. An etching gas which includes at least one of octafluorocyclobutane ($C_4F_8$) gas, $C_4F_6$ gas and $C_5F_8$ gas can be used in the first etching process. For example, the following conditions may be used for the first etching process for the interlayer insulating film 24:

(1) Gas Flow Rate: $C_4F_8$/Ar/$O_2$ or CO=20/500/10 sccm
(2) Pressure in Chamber: 40 mTorr
(3) Power of Radio Frequency: 1.6 kW
(4) Etching Time: 90 seconds
(5) Temperature: 40 degrees C.

Under the above-mentioned conditions of the first etching process, an etching rate of the interlayer insulating film 24 ranges approximately from 600 to 800 nm/min, and an etching rate of the offset nitride films 20 (the offset silicon nitride films 20) ranges approximately from 20 to 30 nm/min. That is, a ratio of the etching rates between the interlayer insulating film 24 and the offset nitride films 20 ranges approximately from 20 to 40. Hereupon, the ratio of the etching rates between the interlayer insulating film 24 and the offset nitride films 20 is equal to or more than 10 in the first etching process. By the above-mentioned first etching process, primary contact holes 56 are formed in the interlayer insulating film 24 so that the offset nitride films 20 can be exposed from the interlayer insulating film 24 as shown in FIG. 1F. Also, in parallel with the forming of the primary contact holes 56, other contact holes 272 are formed in the interlayer insulating film 24 self-aligned to the convex compound structures 50a and 50b so that the high concentration impurity regions 29 can be exposed from the interlayer insulating film 24.

Figure 1G:
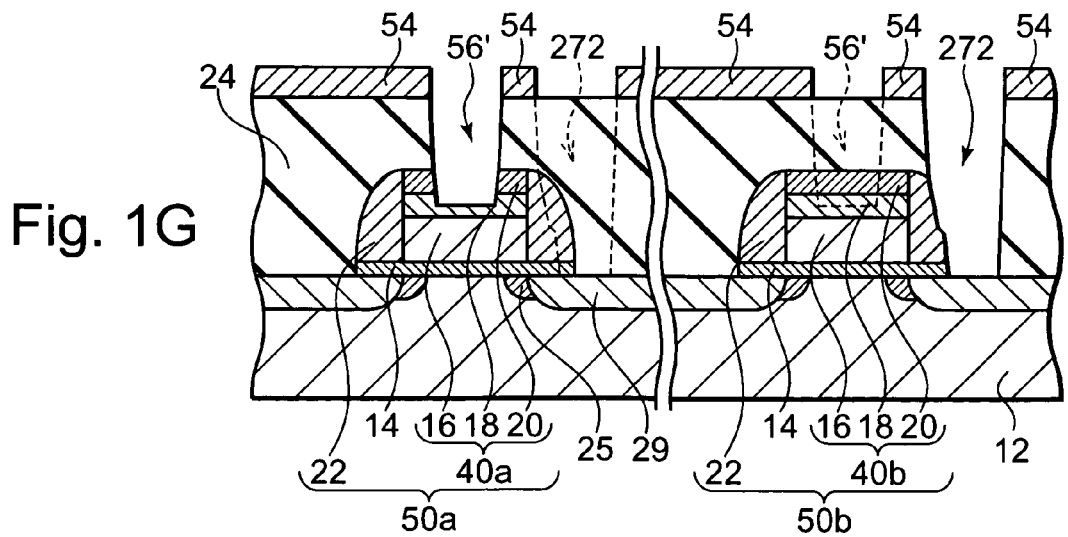

Next, as shown in FIG. 1G, the exposed offset nitride films 20 are etched by a second etching process using the patterned resist mask 54 so that the protective films 18 can be exposed from the interlayer insulating film 24. That is, secondary contact holes 56' are formed by the second etching process. An etching gas which includes at least one of $CHF_3$ gas, $CF_4$ gas and $SF_6$ gas can be used in the second etching process. For example, the following conditions may be used for the second etching process for the exposed offset nitride films 20:

(1) Gas Flow Rate: $CHF_3/CO$=30/170 sccm
(2) Pressure in Chamber: 40 mTorr
(3) Power of Radio Frequency: 1.6 kW
(4) Etching Time: 20 seconds
(5) Temperature: 40 degrees C.

These etching conditions of the exposed offset nitride films 20 are different than the above-mentioned etching conditions of the interlayer insulating films 24. In addition, a mixed gas of Ar and $O_2$ may be used instead of the above-mentioned CO gas. Under the above-mentioned conditions of the second etching process, etching rates of the offset nitride film 20 and the exposed protective film 18 range approximately from 200 to 300 nm/min. A ratio of the etching rates between the offset nitride films 20 and the exposed protective film 18 is small, that is, the ratio ranges from 1 to 1.5. That is, the offset nitride films 20 are etched between 1 and 2 times faster than the exposed protective film 18 in the second etching process. Therefore, the second etching process needs to be ended in accordance with controlling the etching time. Hereupon, the metallic gate electrode film 16 is at least covered with the protective film 18 after the end of the second etching process. In this example, the second etching process is executed so that 30 nm of the protective film 18 is etched, which corresponds to 30% of the thickness of the protective film 18. In addition, the etched amount of the protective film 18 can be arbitrarily set depending on the thickness of the offset nitride film 20. Also, the protective film 18 may have the thickness which is equal to or more than 100 nm to restrain the metallic gate electrode film 16 from being exposed during the second etching process. By the above-mentioned second etching process, the secondary contact holes 56' are formed in the interlayer insulating film 24 so that the protective films 18 can be exposed from the interlayer insulating film 24.

Figure 1H:
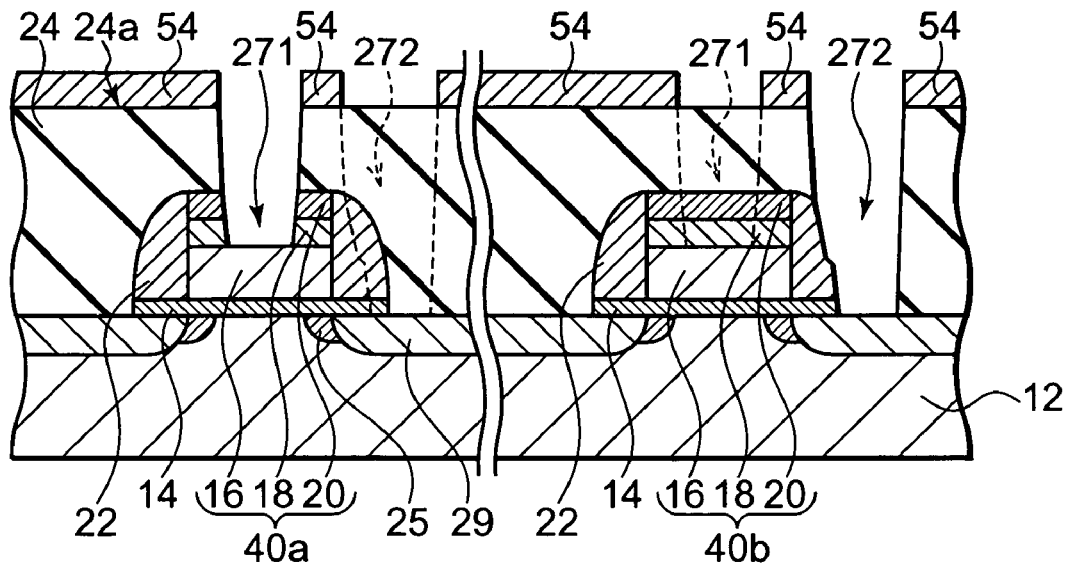

Next, as shown in FIG. 1H, the exposed protective films 18 are etched by a third etching process using the patterned resist mask 54 so that the metallic gate electrode films 16 can be exposed from the interlayer insulating film 24. That is, contact holes 271 are completed by the third etching process. An etching gas which includes at least one of $C_4F_8$ gas, $C_4F_6$ gas and $C_5F_8$ gas is used in the third etching process as well as in the first etching process. For example, the following conditions may be used for the third etching process for the exposed protective film 18:

(1) Gas Flow Rate: $C_4F_8/Ar/O_2$ or CO=20/500/10 sccm
(2) Pressure in Chamber: 40 mTorr
(3) Power of Radio Frequency: 1.6 kW
(4) Etching Time: 90 seconds
(5) Temperature: 40 degrees C.

These etching conditions of the exposed protective film 18 are different from the etching conditions of the exposed offset nitride film 20. Under the above-mentioned conditions of the third etching process, an etching rate of the protective film 18 ranges approximately from 600 to 700 nm/min, and an etching rate of the metallic gate electrode film 16 is equal to or less than approximately 20 nm/min. That is, a ratio of the etching rates between the protective film 18 and the metallic gate electrode film 16 is equal to or more than approximately 30. Construction materials for the protective film 18 are determined so that the etching rate of the protective film 18 can be greater than the etching rate of the metallic gate electrode film 16. In this example, silicon dioxide is selected for the protective films 18. In addition, the ratio of the etching rates between the protective film 18 and the metallic gate electrode film 16 is equal to or more than 10 in the third etching process.

In the third etching process, the ratio of the etching rates between the protective film 18 and the metallic gate electrode film 16 can be enough to restrain the metallic gate electrode films 16 from being overetched. As described above, the contact holes 271, which extend from an upper surface 24a of the interlayer insulating film 24 to upper surfaces of the metallic gate electrode films 16, are completed so that the metallic gate electrode films 16 can be exposed from the interlayer insulating film 24. That is, the contact holes 271 are formed through the first etching process for the primary contact holes 56, the second etching process for the secondary contact holes 56' and the third etching process. After the third etching process ends, the patterned resist mask 54 is removed.

Figure 1I:
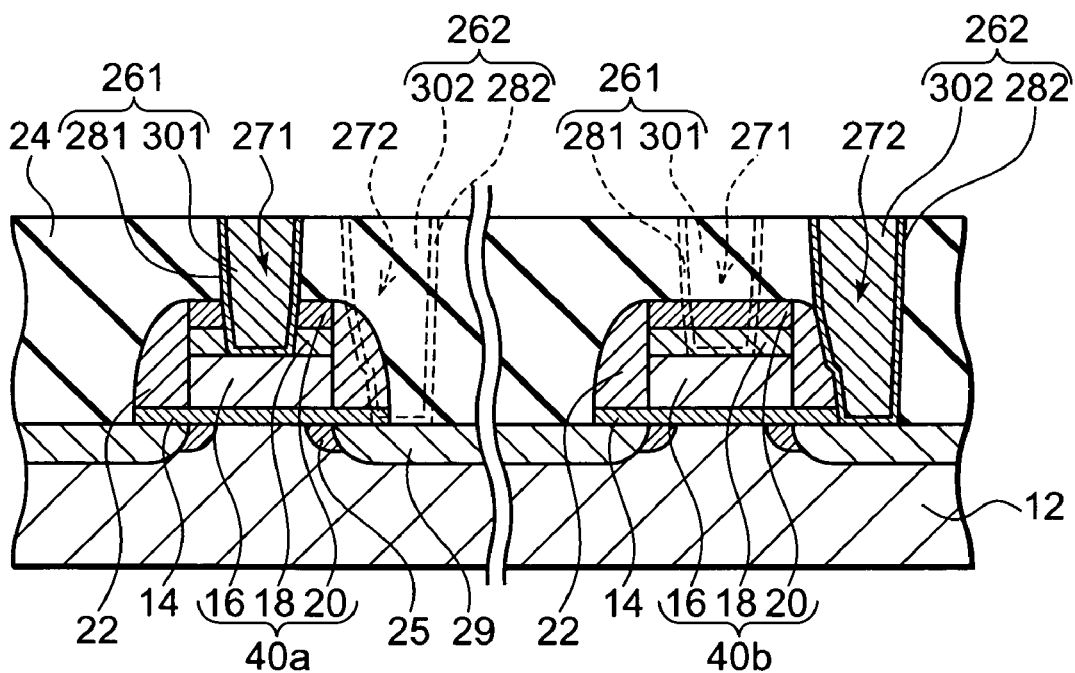
Figure 1J:
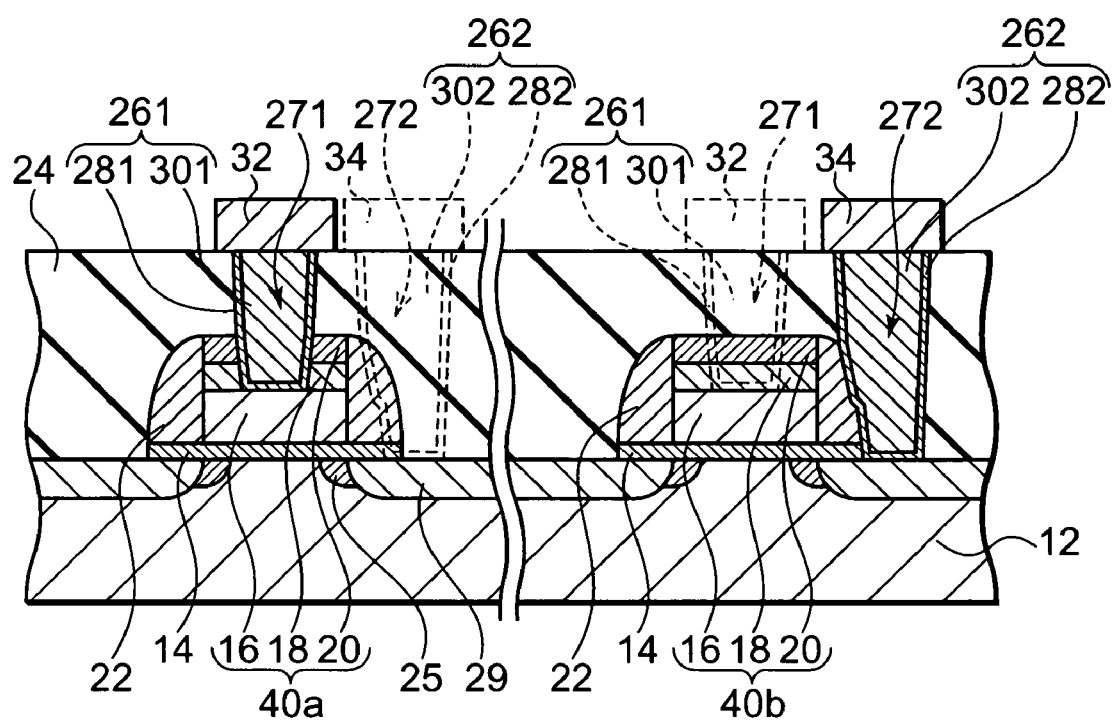

Then, as shown in FIG. 1I, barrier metallic films 281 and 282, which extend from vicinities of the upper surface 24a of the interlayer insulating film 24 respectively to the upper surfaces of the metallic gate electrode films 16 and the upper surfaces of the semiconductor substrate 12, are formed in the contact holes 271 and 272 using a sputtering technique. Hereupon, the barrier metallic films 281 and 282 include, for example, titanium. Thereafter, conductive plugs 301 and 302 which include tungsten are formed in the contact holes 271 and 272, filling conductive material in the contact holes 271 and 272 by the CVD technique. The barrier metallic films 281 and 282 and the conductive plugs 301 and 302 compose contact plugs 261 and 262 which are electrically connected with the metallic gate electrode films 16 (the gate electrodes of the MOS transistors) and the high concentration impurity regions 29 (the drain electrodes and the source electrodes of the MOS transistors). As shown in FIG. 1J, wiring films 32 and 34 are formed on upper surfaces of the contact plugs 261 and 262 and the interlayer insulating film 24. The wiring films 32 and 34 include aluminum base alloy.

According to the first preferred embodiment, since the protective film, whose etching rate is greater than the etching rate of the metallic gate electrode film, is formed between the offset nitride film and the metallic gate electrode film, the overetching of the metallic gate electrode film can be suppressed when the contact hole is formed in the interlayer insulating film on the metallic gate electrode film. Therefore, variations in electrical characteristics such as a resistance value of the metallic gate electrode can be avoided. As a result, reliabilities of not only the semiconductor devices but also equipment composed of the semiconductor devices can be improved.

Figure 2A:
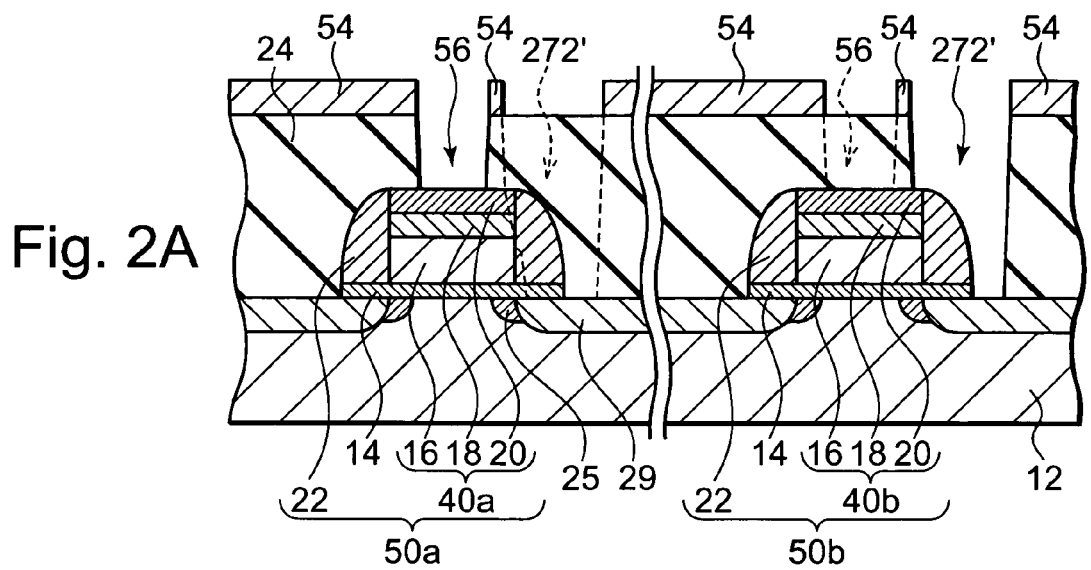
FIGS. 2A–2C illustrate processes of manufacturing a semiconductor device according to a second preferred embodiment of the present invention.
Figure 2B:
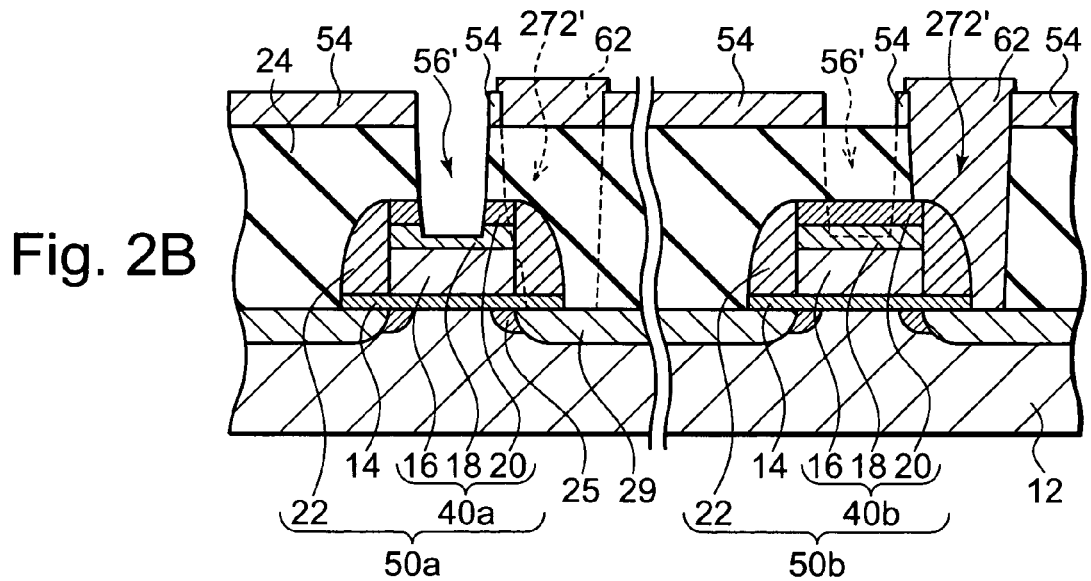
Figure 2C:
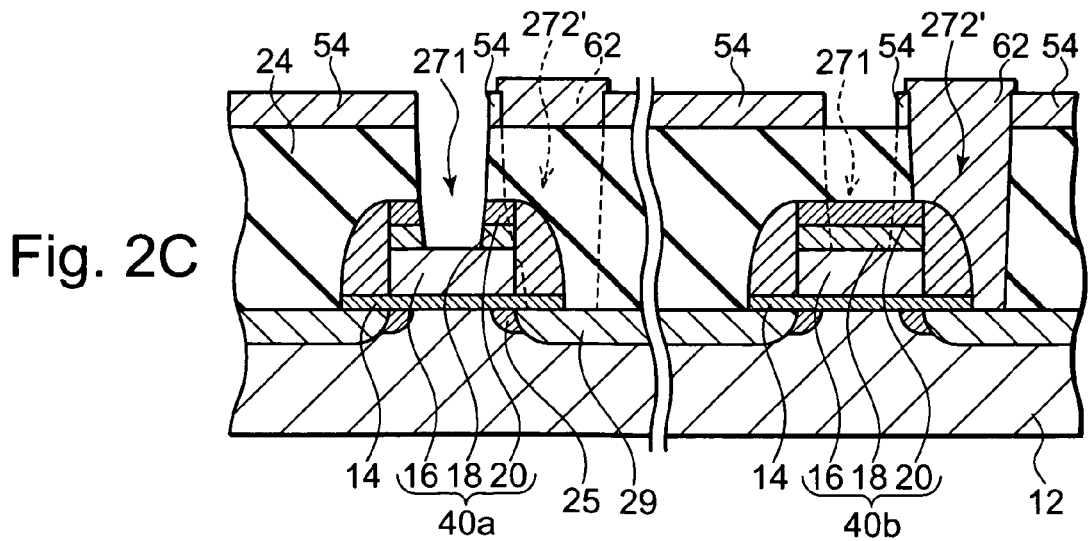

FIGS. 2A–2C illustrate processes of manufacturing a semiconductor device according to a second preferred embodiment of the present invention. The first to third etching processes according to the second preferred embodiment are different from those according to the first preferred embodiment. The other processes according to the second preferred embodiment are the same as those according to the first preferred embodiment.

When contact holes which expose the high concentration impurity regions 29 from the interlayer insulating film 24 are formed closer to the contact holes 56 in the first etching process, the second and third etching processes can be executed as described below.

After the patterned resist mask 54 is formed by the exposure and development processes, primary contact holes 56 are formed in the interlayer insulating film 24 so that the offset nitride films 20 are exposed, and other contact holes 272' are formed so that the high concentration impurity regions 29 are exposed, as shown in FIG. 2A. On such an occasion as this, for example, the other contact holes 272' are filled with resist materials 62, and then, the above-mentioned second etching process is executed so that the protective films 18 can be exposed from the interlayer insulating film 24 as shown in FIG. 2B. Subsequently, the third etching process is executed with the contact holes 272' filled with the resist materials 62, so that the metallic gate electrode films 16 can be exposed in the contact holes 271 as shown in FIG. 2C. Hereupon, an etching rate of the resist material 62 is lower than both an etching rate of the offset nitride film 20 and an etching rate of the protective film 18. Therefore, it can be prevented that the metallic gate electrode film 16 is electrically connected with the high concentration impurity region 29. After the contact holes 271 are formed, the resist materials 62 are removed from the other contact holes 272', and then, the contact plugs 261 and 262 and the wiring films 32 and 34 are formed as shown in FIGS. 1I and 1J.

According to the second preferred embodiment, even if the other contact hole 272' formed on the high concentration impurity region 29 overlaps onto the stacked structure 40a or 40b, the other contact hole 272' formed on the metallic gate electrode film 16 can be prevented from exposing the metallic gate electrode film 16, since the offset nitride film 20 and the protective film 18 within the contact hole 271 are etched while the other contact hole 272' is filled with the resist material 62. As a result, it can be prevented that the gate electrode is electrically connected with the source region or the drain region in the MOS transistor.

FIGS. 3A–3K illustrate processes of manufacturing a semiconductor device according to a third preferred embodiment of the present invention.

As shown in FIG. 3A, after a semiconductor substrate 12 which includes silicon is provided, a thin oxidized layer 141 is formed on the semiconductor substrate 12. In this example, the thin oxidized layer 141 includes aluminum oxide. Then, a stacked layer 500, which includes a metallic layer 161, a first covering layer 721 and a second covering layer 201, is formed on the thin oxidized layer 141 by the CVD techniques. In this example, a titanium nitride layer is formed on the thin oxidized layer 141 as the metallic layer 161, a polycrystalline silicon layer is formed on the metallic layer 161 as the first covering layer 721, and a silicon nitride layer is formed on the first covering layer 721 as the second covering layer 201. Also, the thin oxidized layer 141, the metallic layer 161 and the second covering layer 201 have thicknesses which are the same as those in the first preferred embodiment. A thickness of the first covering layer 721 (the polycrystalline silicon layer) ranges from 20 to 30 nm. In addition, a tungsten nitride layer or a tantalum nitride layer may be formed on the thin oxidized layer 141 as the metallic layer 161, instead of the titanium nitride layer.

Next, a mask, which has a predetermined configuration of a gate electrode of a MOS transistor, is formed on the second covering layer 201, which is not shown in the figure. Then, the second covering layer 201, the first covering layer 721 and the metallic layer 161 of the stacked layer 500 are etched using the mask. That is, the second covering layer 201, the first covering layer 181 and the metallic layer 161 are etched so as to have the predetermined configuration of the gate electrode. As a result, as shown in FIG. 3B, metallic gate electrode films 16 being used as metal gate electrodes of the MOS transistors, protective films 72 (polycrystalline silicon films 72) and offset nitride films 20 (offset silicon nitride films 20) are formed on the thin oxidized film 141. Hereupon, the metallic gate electrode films 16, protective films 72 and offset nitride films 20 compose stacked structures 80a and 80b. Then, low concentration impurity regions 25, being used as source regions and drain regions of the MOS transistors, are formed in the semiconductor substrate 12 near the metallic gate electrode films 16 self-aligned to the stacked structures 80a and 80b.

Subsequently, gate oxidized films 14, which have larger configurations than the predetermined configurations of the gate electrodes, are formed on the semiconductor substrate 12 by etching the oxidized layer 141, as shown in FIG. 3C, at areas where sidewall portions 22 are to be formed on the gate oxidized films 14, as in the first preferred embodiment. In more detail, a silicon nitride layer having a thickness of 100 nm is formed on the semiconductor substrate 12 and gate oxidized films 14, for example, by the CVD techniques, so that the stacked structures 80a and 80b and date oxidized films 14 can be covered with the silicon nitride layer. Then, the silicon nitride layer is etched by anisotropic etching process. As a result, as shown in FIG. 3C, insulating sidewall portions 22 are formed on the gate oxidized films 14 and sidewalls 80aa and 80bb of the stacked structures 80a and 80b. The insulating sidewall portions 22 and the stacked structures 80a and 80b compose convex compound structures 90a and 90b spaced away from each other at a predetermined interval. Also, when the oxidized layer 141 including the aluminum oxide, hafnium aluminate or hafnium oxide which has a high dielectric constant is formed on the semiconductor substrate 12, the oxidized layer 141 may be etched using the stacked structures 80a and 80b as a mask by a wet chemical etching process after the stacked structures 80a and 80b are formed and before the sidewall portions 22 are formed.

As shown in FIG. 3D, high concentration impurity regions 29, being also used as the source regions and drain regions of the MOS transistors, are formed in the semiconductor substrate near the metallic gate electrode films 16 self-aligned to the convex compound structures 90a and 90b. The low concentration impurity region 25 and the high concentration impurity region 29 compose a Light Doped Drain (LDD) structure. Then, an interlayer insulating film 24 is formed on the semiconductor substrate 12 for example, by the CVD techniques, so that the convex compound structures 90a and 90b can be covered with the interlayer insulating film 24. An upper surface of the interlayer insulating film 24 is made even by the CMP techniques. As a result, in this example, the interlayer insulating film 24 has a thickness of 500 nm.

Figure 3E:
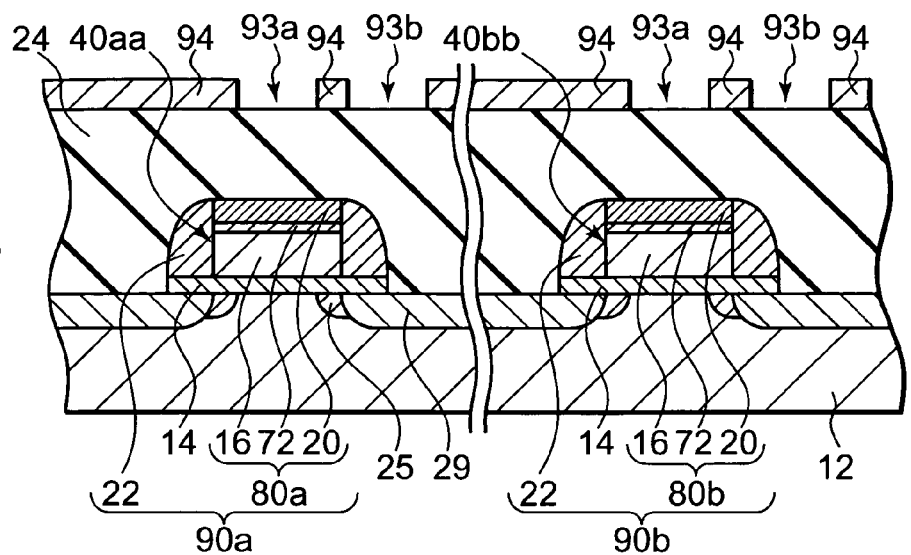
Figure 3F:
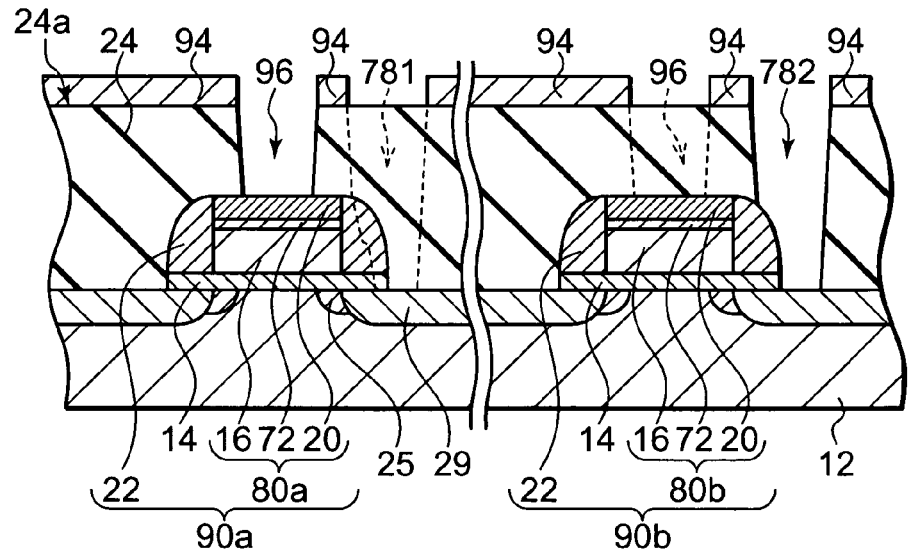

As shown in FIG. 3E, after forming a resist layer on the interlayer insulating film 24, a patterned resist mask 94 is formed by exposure and development processes. The patterned resist mask 94 has openings 93a and 93b to expose the interlayer insulating film 24 on the convex compound structures 90a and 90b and the high concentration impurity regions 29. Then, the interlayer insulating film 24 exposed by the openings 93a and 93b of the patterned resist mask 94 is etched by a first etching process as shown in FIG. 3F. An etching gas which includes at least one of $C_4F_8$ gas, $C_4F_6$ gas and $C_5F_8$ gas can be used in the first etching process. For example, the following conditions may be used for the first etching process for the interlayer insulating film 24:

(1) Gas Flow Rate: $C_4F_8$/Ar/$O_2$ or CO=20/500/10 sccm
(2) Pressure in Chamber: 40 mTorr (3) Power of Radio Frequency: 1.6 kW
(4) Etching Time: 90 seconds
(5) Temperature: 40 degrees C.

Under the above-mentioned condition of the first etching process, an etching rate of the interlayer insulating film 24 ranges approximately from 600 to 800 nm/min, and an etching rate of the offset nitride films 20 (the offset silicon nitride films 20) ranges approximately from 20 to 30 nm/min. That is, a ratio of the etching rates between the interlayer insulating film 24 and the offset nitride films 20 ranges approximately from 20 to 40. Hereupon, the ratio of the etching rates between the interlayer insulating film 24 and the offset nitride films 20 is equal to or more than 10 in the first etching process. By the above-mentioned first etching process, primary contact holes 96 are formed in the interlayer insulating film 24 so that the offset nitride films 20 can be exposed from the interlayer insulating film 24 as shown in FIG. 3F. Also, in parallel with the forming of the primary contact holes 96, other contact holes 782 are formed in the interlayer insulating film 24 self-aligned to the convex compound structures 90a and 90b so that the high concentration impurity regions 29 can be exposed from the interlayer insulating film 24.

Figure 3G:
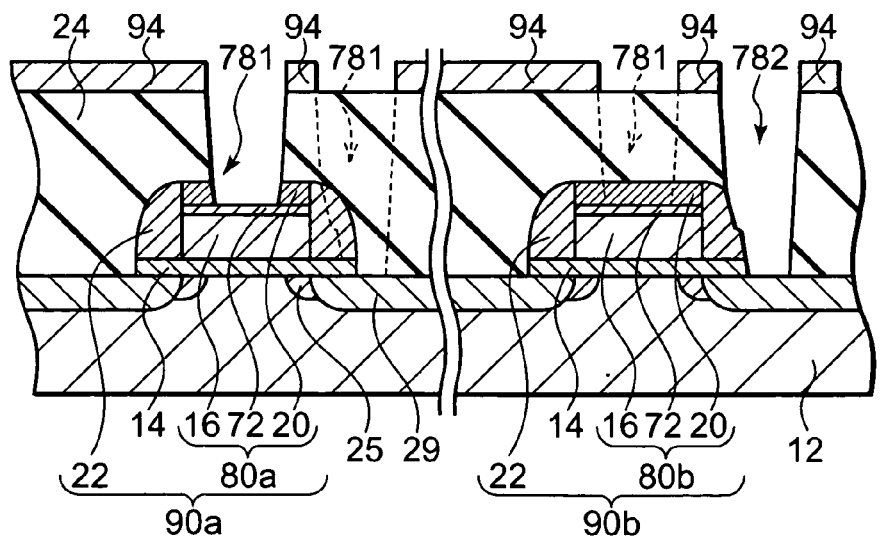

Next, as shown in FIG. 3G, the exposed offset nitride films 20 are etched by a second etching process using the patterned resist mask 94, so that the protective films 18 can be exposed from the interlayer insulating film 24. That is, contact holes 781 are formed by the second etching process. An etching gas which includes at least one of $CHF_3$ gas, $CF_4$ gas and $SF_6$ gas can be used in the second etching process. For example, the following conditions may be used for the second etching process for the exposed offset nitride films 20:

(1) Gas Flow Rate: $CHF_3$/CO=30/170 sccm
(2) Pressure in Chamber: 40 mTorr
(3) Power of Radio Frequency: 1.6 kW
(4) Etching Time: 20 seconds
(5) Temperature: 40 degrees C.

These etching conditions are different than the above-mentioned etching conditions of the interlayer insulating films 24. In addition, a mixed gas of Ar and $O_2$ may be used instead of the above-mentioned CO gas. Under the above-mentioned conditions of the second etching process, an etching rate of the offset nitride film 20 is much greater than an etching rate of the protective film 72 (the polycrystalline silicon film 72). That is, since a ratio of the etching rates between the offset nitride film 20 and the protective film 72 is great, the offset nitride films 20 are more selectively etched than the protective films 72 in the second etching process. By the above-mentioned second etching process, the contact holes 781 are formed in the interlayer insulating film 24 so that the protective films 72 can be exposed from the interlayer insulating film 24. After the second etching process ends, the patterned resist mask 94 is removed.

Figure 3H:
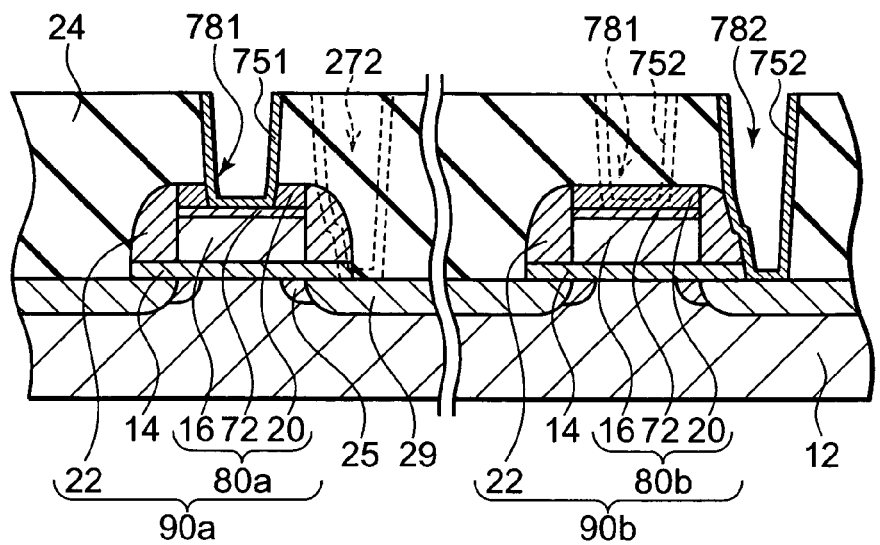
Figure 3I:
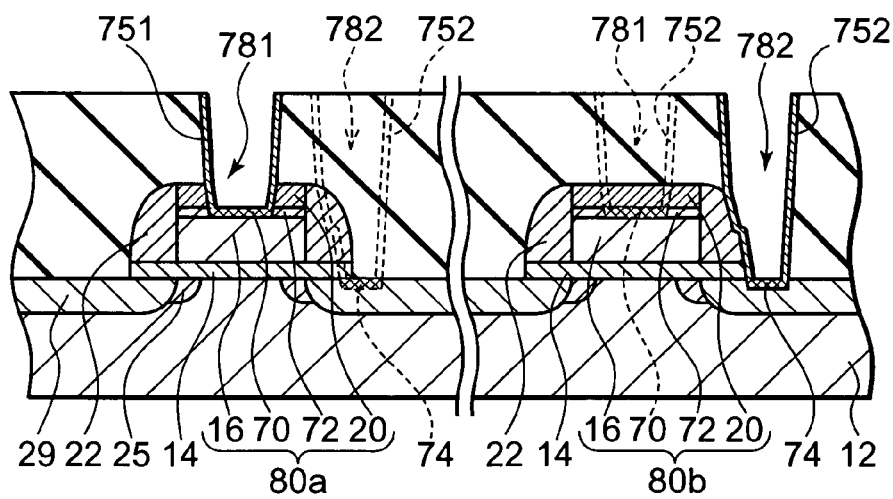

Next, as shown in FIG. 3H, refractory metallic films 751 and 752 are formed on the exposed protective films 72, the high concentration impurity regions 29 and sidewalls of the interlayer insulating film 24 in the contact holes 781 and 782, for example, using the sputtering technique. In this example, the refractory metallic films 751 and 752 include titanium and function as barrier metallic films. In addition, the refractory metallic films 751 and 752 may include one of tungsten, cobalt and nickel instead of titanium. Then, the refractory metallic films 751 and 752 are reacted with the protective films 72 which include the polycrystalline silicon and the high concentration impurity regions 29 which include silicon, through a heat treatment process, for example, with a temperature of approximately 600 degrees C. This chemical reaction between metallic material and silicon is called a metallic silicide reaction. By the metallic silicide reactions, conductive films 70 and 74 are formed on the metallic gate electrode films 16 and the semiconductor substrate 12. In this example, the conductive films 70 and 74 are titanium silicide films ($TiSi_2$) as shown in FIG. 3I.

The conductive films 70 and 74 are capable of reducing contact resistances between the metallic gate electrodes 16 and subsequently formed contact plugs 731 and between the high concentration impurity regions 29 and subsequently formed contact plugs 732. Alternatively, the refractory metallic films 751 and 752 may be formed on the exposed protective films 72 and the high concentration impurity regions 29 by the CVD technique with a temperature of approximately 600 degrees C. On such an occasion as this, in parallel with the forming of the refractory metallic films 751 and 752, the metallic silicide reactions are executed so that the conductive films 70 and 74 can be formed on the metallic gate electrode films 16 and the high concentration impurity regions 29.

Figure 3J:
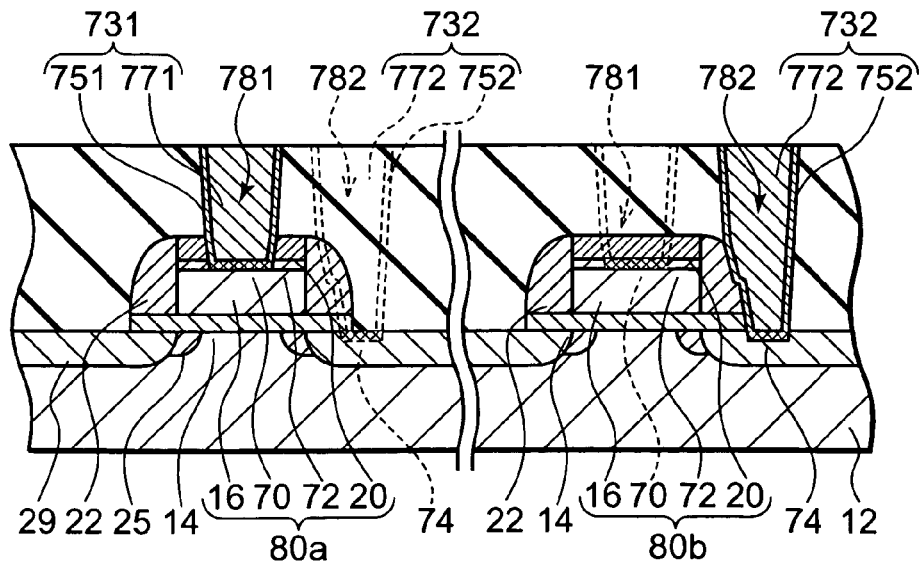
Figure 3K:
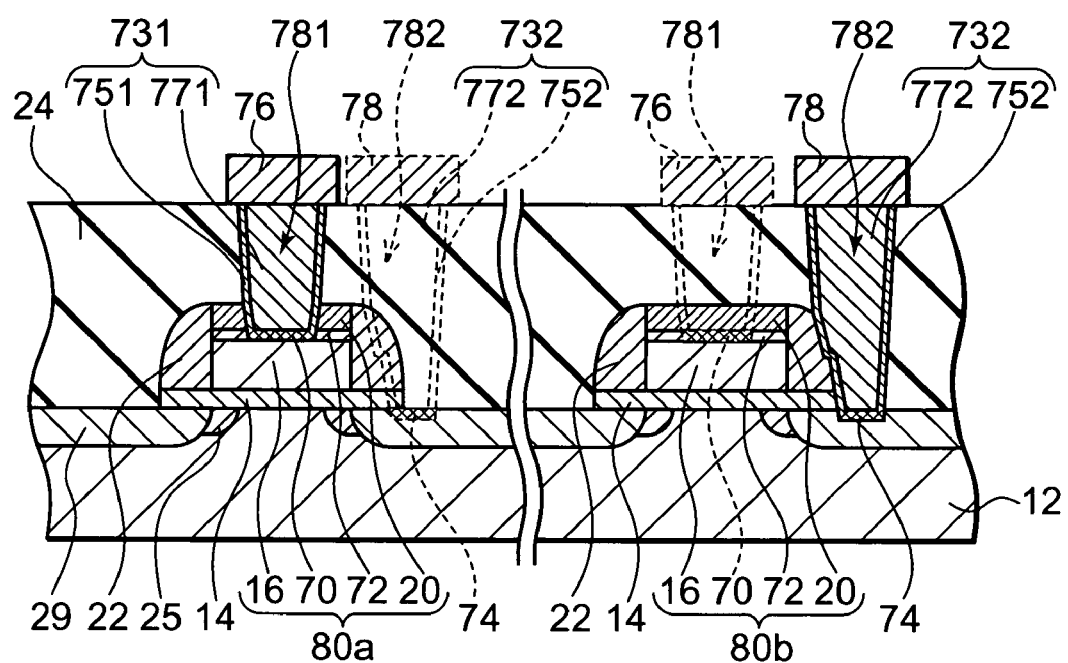

Subsequently, as shown in FIG. 3J, conductive plugs 771 and 772 which include tungsten are formed in the contact holes 781 and 782, by filling conductive material in the contact holes 781 and 782 by the CVD technique. The refractory metallic films 751 and 752 and the conductive plugs 771 and 772 compose contact plugs 731 and 732 which are electrically in contact with the metallic gate electrode films 16 (the gate electrodes of the MOS transistors) and the high concentration impurity regions 29 (the drain electrodes and the source electrodes of the MOS transistors) through the conductive films 70 and 74. As shown in FIG. 3K, wiring films 76 and 78 are formed on upper surfaces of the contact plugs 731 and 732 and the interlayer insulating film 24. The wiring films 76 and 78 include aluminum base alloy.

According to the third preferred embodiment, since the protective film which is reacted with the refractory metallic film is initially formed between the offset nitride film and the metallic gate electrode film, and since the conductive film which electrically connects the contact plug with the metallic gate electrode film is formed on the metallic gate electrode film by the chemical reaction, the overetching of the metallic gate electrode film can be suppressed when the contact hole is formed in the interlayer insulating film on the metallic gate electrode film. Also, since the contact plug is electrically connected with the metallic gate electrode film through the conductive film which is formed by the chemical reaction, the contact hole can be easily formed on the metallic gate electrode film with less etching processes, while the metallic gate electrode film is not overetched. Therefore, variations in the electrical characteristics, such as the resistance value of the metallic gate electrode, can be avoided. As a result, reliabilities of not only the semiconductor devices but also the equipment composed of the semiconductor devices can be improved. In addition, in each of the above mentioned three preferred embodiments, a polycrystalline silicon gate electrode film or a germanium-silicon alloyed film may be formed between the metallic gate electrode film and the gate oxidized film.

What is claimed is:
1. A manufacturing method of a semiconductor device, comprising:
forming a metallic gate electrode film, a protective film and an offset nitride film sequentially on a semiconductor substrate to compose a stacked structure;

covering the stacked structure and the semiconductor substrate with an insulating film;

etching the insulating film to expose the offset nitride film;

etching the exposed offset nitride film to expose the protective film;

etching the exposed protective film to expose the metallic gate electrode film under predetermined etching conditions, wherein an etching rate of the protective film is greater than an etching rate of the metallic gate electrode film, wherein a same etching mask is used during said etching the insulating film, said etching the exposed offset nitride film and said etching the exposed protective film, to form a contact hole; and forming a conductive plug in the contact hole.

2. The manufacturing method according to claim 1, wherein the protective film includes silicon oxide.

3. The manufacturing method according to claim 2, wherein the exposed protective film is etched using an etching gas which includes one of $C_4F_8$, $C_4F_6$ and $C_5F_8$.

4. The manufacturing method according to claim 1, wherein an etching rate of the exposed protective film is at least 10 times greater than an etching rate of the metallic gate electrode film under the predetermined etching conditions.

5. The manufacturing method according to claim 1, wherein the metallic gate electrode film includes at least one of titanium nitride, tungsten nitride and tantalum nitride.

6. The manufacturing method according to claim 1, wherein the conductive plug includes tungsten.

7. The manufacturing method according to claim 1, wherein the protective film is formed so as to have a thickness which is equal or more than 100 nm.

8. The manufacturing method according to claim 1, wherein the exposed offset nitride film is etched using an etching gas which includes one of $CHF_3$, $CF_4$ and $SF_6$.

9. The manufacturing method according to claim 1, wherein the exposed offset nitride film is etched between 1 and 2 times faster than the exposed protective film.

10. The manufacturing method according to claim 1, further comprising:

forming an impurity region in the semiconductor substrate near the metallic gate electrode film self-aligned to the stacked structure, wherein the impurity region is covered with the insulating film; and removing the insulating film on the impurity region during said etching the insulating film to form another contact hole.

11. The manufacturing method according to claim 10, further comprising:

after said removing the insulating film, filling a resist material in the another contact hole, wherein said etching the exposed offset nitride film and said etching the exposed protective film are executed with the another contact hole filled with the resist material.

12. The manufacturing method according to claim 1, wherein the predetermined etching conditions are different than etching conditions of the exposed offset nitride film.

13. The manufacturing method according to claim 12, wherein the etching conditions of the exposed offset nitride film are different than etching conditions of the insulating film.

14. A manufacturing method of a semiconductor device, comprising:

forming a gate layer, a protective layer and a nitride layer sequentially on a substrate;

etching the gate layer, the protective layer, and the nitride layer to form a stacked structure including in sequence a gate electrode, a protective film and an offset nitride film;

covering the stacked structure and the substrate with an insulating film;

etching the insulating film to expose the offset nitride film;

etching the exposed offset nitride film to expose the protective film;

etching the exposed protective film to expose the gate electrode under first etching conditions, wherein an etching rate of the protective film is greater than an etching rate of the gate electrode, wherein a same etching mask issued during said etching the insulating film, said etching the exposed offset nitride film and said etching the exposed protective film, to form a contact hole; and forming a conductive plug in the contact hole.

15. The manufacturing method according to claim 14, wherein the exposed protective film is etched using a first etching gas which includes one of $C_4F_8$, $C_4F_6$ and $C_5F_8$, and the exposed offset nitride film is etched using a second etching gas which includes one of $CHF_3$, $CF_4$ and $SF_6$.

16. The manufacturing method according to claim 14, wherein an etching rate of the exposed protective film is at least 10 times greater than an etching rate of the gate electrode under the first etching conditions, and the exposed offset nitride film is etched between 1 and 2 times faster than the exposed protective film.

17. The manufacturing method according to claim 14, further comprising:

forming an impurity region in the substrate near the gate electrode and self-aligned to the stacked structure, wherein the impurity region is covered with the insulating film; and removing the insulating film on the impurity region during said etching the insulating film to form another contact hole.

18. The manufacturing method according to claim 17, further comprising:

after said removing the insulating film, filling a resist material in the another contact hole, wherein said etching the exposed offset nitride film and said etching the exposed protective film are executed with the another contact hole filled with the resist material.

19. A manufacturing method of a semiconductor device, comprising:

forming a gate electrode film, a protective film and an offset nitride film sequentially on a substrate to compose a stacked structure;

covering the stacked structure and the substrate with an insulating film;

etching the insulating film to expose the offset nitride film;

etching the exposed offset nitride film using a first etching gas including one of $CHF_3$, $CF_4$ and $SF_6$ to expose the protective film;

etching the exposed protective film using a second etching gas which includes one of $C_4F_8$, $C_4F_6$ and $C_5F_8$ to expose the gate electrode film under first etching conditions, wherein an etching rate of the protective film is greater than an etching rate of the gate electrode film, wherein a same etching mask issued during said etching the insulating film, said etching the exposed offset nitride film and said etching the exposed protective film, to form a contact hole; and forming a conductive plug in the contact hole.

20. The manufacturing method according to claim 19, wherein an etching rate of the exposed protective film is at least 10 times greater than an etching rate of the gate electrode film under the first etching conditions, and the exposed offset nitride film is etched between 1 and 2 times faster than the exposed protective film.

21. The manufacturing method according to claim 19, further comprising:

forming an impurity region in the substrate near the gate electrode film and self-aligned to the stacked structure, wherein the impurity region is covered with the insulating film; and removing the insulating film on the impurity region during said etching the insulating film to form another contact hole.

22. The manufacturing method according to claim 21, further comprising:

after said removing the insulating film, filling a resist material in the another contact hole, wherein said etching the exposed offset nitride film and said etching the exposed protective film are executed with the another contact hole filled with the resist material.

* * * * *